(12) United States Patent
Brodsky et al.

(10) Patent No.: US 7,795,724 B2
(45) Date of Patent: Sep. 14, 2010

(54) SANDWICHED ORGANIC LGA STRUCTURE

(75) Inventors: William L. Brodsky, Binghamton, VT (US); James A. Busby, New Paltz, NY (US); Bruce J. Chamberlin, Vestal, NY (US); Mitchell G. Ferrill, Little Meadows, PA (US); David L. Questad, Hopewell Junction, NY (US); Robin A. Susko, Owego, NY (US)

(73) Assignee: International Business Machines Corporation, Armonk, NY (US)

( * ) Notice: Subject to any disclaimer, the term of this patent is extended or adjusted under 35 U.S.C. 154(b) by 447 days.

(21) Appl. No.: 11/847,606

(22) Filed: Aug. 30, 2007

(65) Prior Publication Data

US 2009/0057865 A1 Mar. 5, 2009

(51) Int. Cl.
*H01L 23/34* (2006.01)
(52) U.S. Cl. ........................ 257/712; 257/717
(58) Field of Classification Search ........... None
See application file for complete search history.

(56) References Cited

U.S. PATENT DOCUMENTS

| | | | | |
|---|---|---|---|---|
| 6,317,326 B1 * | 11/2001 | Vogel et al. | ........... | 361/704 |
| 6,486,562 B1 * | 11/2002 | Kato | ........... | 257/778 |
| 6,731,012 B1 * | 5/2004 | Brodsky et al. | ........... | 257/778 |
| 6,750,551 B1 * | 6/2004 | Frutschy et al. | ........... | 257/785 |
| 6,891,259 B2 * | 5/2005 | Im et al. | ........... | 257/687 |
| 6,936,919 B2 * | 8/2005 | Chuang et al. | ........... | 257/717 |
| 6,979,782 B1 | 12/2005 | Brodsky et al. | | |
| 7,037,753 B2 * | 5/2006 | Brodsky et al. | ........... | 438/108 |
| 7,061,102 B2 * | 6/2006 | Eghan et al. | ........... | 257/713 |
| 7,268,428 B2 * | 9/2007 | Edwards et al. | ........... | 257/712 |
| 7,518,235 B2 * | 4/2009 | Coico et al. | ........... | 257/719 |
| 2002/0125564 A1 * | 9/2002 | Shibata | ........... | 257/706 |
| 2002/0137369 A1 | 9/2002 | Edwards et al. | | |
| 2006/0202325 A1 * | 9/2006 | Coico et al. | ........... | 257/718 |

* cited by examiner

*Primary Examiner*—Scott B Geyer
(74) *Attorney, Agent, or Firm*—Gibb I.P. Law Firm, LLC

(57) ABSTRACT

An LGA structure is provided having at least one semiconductor device over a substrate and a mechanical load apparatus over the semiconductor device. The structure includes a load-distributing material between the mechanical load apparatus and the substrate. Specifically, the load-distributing material is proximate a first side of the semiconductor device and a second side of the semiconductor device opposite the first side of the semiconductor device. Furthermore, the load-distributing material completely surrounds the semiconductor device and contacts the mechanical load apparatus, the substrate, and the semiconductor device. The load-distributing material can be thermally conductive and comprises an elastomer and/or a liquid. The load-distributing material comprises a LGA interposer adapted to connect the substrate to a PCB below the substrate and/or a second substrate. Moreover, the load-distributing material comprises compressible material layers and rigid material layers. The load-distributing material comprises a rigid material incased in a compressible material.

12 Claims, 5 Drawing Sheets

SANDWICHED ORGANIC LGA STRUCTURE

BACKGROUND

1. Field of the Invention

The embodiments of the invention provide a device, method, etc. for a sandwiched organic land grid array (LGA) structure.

2. Description of the Related Art

LGA organic packages undergo tremendous stresses exerted upon the module via the LGA retention schemes. Currently, the cinch LGA contact system is actuated at an average force of approximately 85 grams per contact. There are attempts to reduce this force to the 40 to 65 gram range. For a 1657 input/output (I/O) module at 65 grams, the clamping force is 237 pounds of clamping force. These stresses can cause warping and cracks in the organic substrate, resulting in decreased reliability. The embodiments of the invention provide a structure to disperse the stresses, thus reducing the possibility for inducing reliability related defects.

Current industry standard solutions for managing the stresses basically center around a peripheral stiffener ring, or metal back plates places on the other side of the board to help prevent warping. Both of these solutions are expensive, difficult to assemble, limit in their success to manage the stresses, or require a larger substrate due to depopulated contacts under the device die.

Furthermore, 3-D chip/die stacking is a technology in electronic packaging that optimizes printed wiring real estate, minimizes enclosure volume above low height modules, and minimizes data bus lengths. 3-D chip/module stacking is known in the art, however current 3-D module assembly techniques require the soldering of each module/die layer to the other or stacking of die then wire bonding between die and substrate. This joining complicates assembly issues: known good die/module methodology is required and expensive; solder hierarchy is complicated and expensive; and, rework is not always possible. These problems drive module cost higher and higher.

3-D chip/die stacking is an up and coming technology in the packaging world today. Current techniques for assembly require the "layers" of the stack be soldered to the previous layers.

A strict assembly hierarchy needs to be followed, mostly to preserve previous solder connections, and this solder hierarchy is expensive. In addition, the solder joints have reliability issues.

SUMMARY

The embodiments of the invention provide a structure, method, etc. for a sandwiched organic LGA structure having at least one semiconductor device over a substrate and a mechanical load apparatus over the semiconductor device. The structure further includes a load-distributing material between the mechanical load apparatus and the substrate. Specifically, the load-distributing material is proximate a first side of the semiconductor device and proximate a second side of the semiconductor device opposite the first side of the semiconductor device.

Furthermore, the load-distributing material completely surrounds the semiconductor device and contacts the semiconductor device, the mechanical load apparatus, and the substrate. There is a non-load bearing thermally conductive material, also a compressible material, between the mechanical load apparatus/heatsink and the semiconductor device. The load-distributing material can be thermally conductive and compressible, such as an elastomer, or incompressible, such as a liquid. The load-distributing material comprises an LGA interposer adapted to connect the substrate to a printed circuit board (PCB) below the substrate and/or a second substrate. Moreover, when the load-distributing material is a compressible material it comprises compressible material layers and rigid material layers. The load-distributing material can comprise a rigid material incased in a compressible material. Moreover, when the load-distributing material is a liquid, there is a cap over the top side of the substrate which also covers the chip/semiconductor device. The cap creates a cavity to contain the liquid.

Additionally, the structure includes the PCB below the substrate, a lower substrate below the PCB, and at least one lower semiconductor device below the lower substrate. A lower mechanical load apparatus is below the lower semiconductor device and a lower load-distributing material is between the lower mechanical load apparatus and the lower substrate. Moreover, the lower load-distributing material is proximate a first side of the lower semiconductor device and proximate a second side of the lower semiconductor device opposite the first side of the lower semiconductor device.

A method of forming a LGA structure is also provided, including forming at least one semiconductor device over a substrate. Next, the method forms a load-distributing material above the substrate such that the load-distributing material is proximate a first side of the semiconductor device and proximate a second side of the semiconductor device, wherein the first side is opposite the second side. The load-distributing material is formed such that the load-distributing material completely surrounds the semiconductor device and contacts the mechanical load apparatus, the substrate, and the semiconductor device. The load-distributing material is also formed such that the load-distributing material can be thermally conductive, and such that the load-distributing material comprises an elastomer and/or a liquid. Moreover, the load-distributing material is formed such that it comprises a LGA interposer adapted to connect the substrate to a PCB below the substrate and/or a second substrate.

The method further includes, prior to forming a mechanical load apparatus, forming a non-load bearing thermally conductive material between the semiconductor device and the mechanical load apparatus. Subsequently, the mechanical load apparatus is formed over the load-distributing material.

Accordingly, the embodiments of the invention provide a method and structure for distributing the physical/mechanical forces placed upon an organic substrate as a result of lid, heatsink and retention hardware to prevent stresses which result in reliability concerns.

Furthermore, the embodiments herein allow for 3-D chip/module stacking, however uses an LGA-like approach which involves the use of interposers to which the die/modules are held against, completing the circuit. The absence of a solder requirement eliminates the concerns listed above and also aids in improving reliability. The interposer can allow for expansion, thus reducing coefficient of thermal expansion (CTE) mismatch issues.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
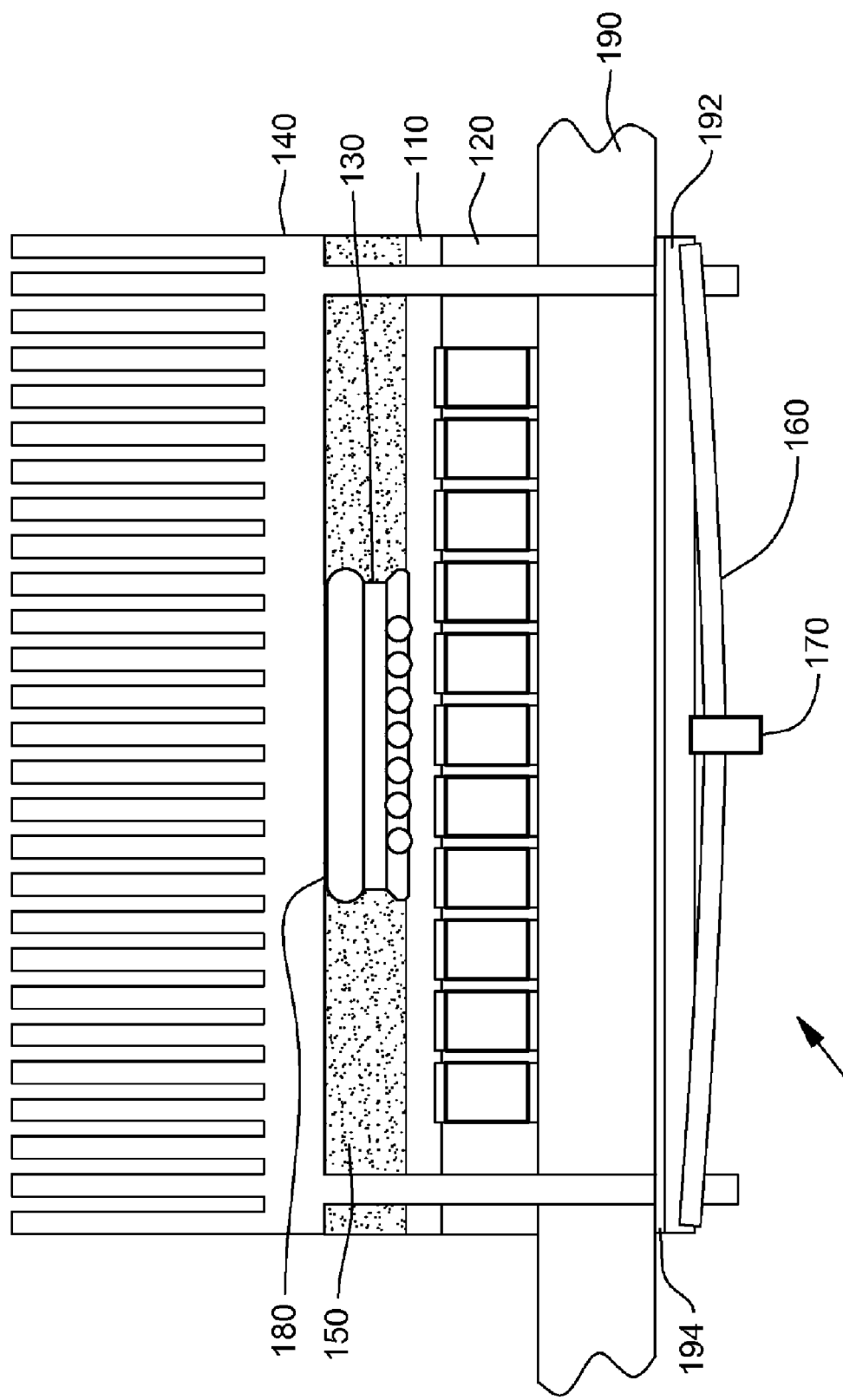
FIG. 1 is a diagram illustrating a sandwiched organic LGA structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments of the invention provide a method and structure for distributing the physical/mechanical forces placed upon an organic substrate as a result of lid, heatsink and retention hardware to prevent stresses which result in reliability concerns.

Furthermore, the embodiments herein allow for 3-D chip/module stacking, however uses an LGA-like approach which involves the use of interposers to which the die/modules are held against, completing the circuit. The absence of a solder requirement eliminates the concerns listed above and also aids in improving reliability. The interposer can allow for expansion, thus reducing TCE mismatch issues.

One embodiment of the invention is to place a filler between the heatsink/cap and substrate. This filler can be either a stiff elastomer or liquid and will directly and equally couple the stresses induced by retention hardware through the complete module. The equal dispersion will prevent warping, localized/focused stresses.

The material can be an inert liquid or an elastomer. The elastomer can be similar to the Dow LCS-7 Series (45, 46, 47), available from Dow Global Technologies Inc., Midland, Mich. The use of an elastomer or liquid will allow for rework (previous solutions prevented rework). If the chip and substrate are capped a liquid can be placed in the chip cavity by filling through a hole in the lid which is eventually sealed, as is commonly known within the art. The liquid and/or elastomer can also aid in improving the thermal properties of the module.

Referring to FIG. 1, a structure 100 is shown, which includes a chip 130 (also referred to herein as the "semiconductor device") attached to an organic substrate 110 and a heat sink 140 (also referred to herein as the "mechanical load apparatus") over the chip 130. The structure 100 also has an LGA-like interposer 120 below the organic substrate 110. An elastomer 150 (also referred to herein as the "load-distributing material") is provided between the heat sink 140 and the organic substrate 110, which becomes compressed when a load spring plate 160 and a load screw 170 (retention hardware) are engaged. The load spring plate 160 is below the interposer 120, wherein the load screw 170 is in a middle portion thereof. The elastomer 150 can be thermally conductive and will act as a distribution layer for the forces involved in engaging the interposer 120. It allows uniform pressure distribution across the organic substrate 110.

The elastomer 150 can also be filled, possibly with spheres (also referred to herein as the "rigid material"), not shown, that act to control the amount of compression allowed when pressure is applied. The spheres are between the organic substrate 110 and the heatsink 140. They could also act as height control that prevents the compression from coming too close to the chip 130 and pushing all of a thermal conductor 180 out, wherein the thermal conductor 180 is a non-load bearing material between the chip 130 and the heatsink 140. This allows optimization of thermal performance. Using a tolerance analysis, rigid layer thickness is designed to match the minimum spacing and the compressible material is designed to accommodates the tolerance range.

The chip 130 could have a cap or cover plate over it. The cap could cover the chip 130 and the entire top of the substrate 110. The chip 130 would have a thermal interface material (TIM) which could be a gel, grease, or fluid contained in a structure. The chip 130 could be underfilled.

There could be cutout in the elastomer 150 for the chip capacitors found on the outer surface of the organic substrate 110; or, the elastomer 150 could compress and conform to the caps, without cutouts.

The load screw 170 can be located in the center as shown, or have one on each corner or each side of the organic substrate 110.

A PCB 190 is also provided between the interposer 120 and a stiffener 192, wherein a top of the PCB 190 contacts a bottom of the interposer 120. The stiffener 192 is below the PCB 190 and contacts top surfaces of the spring plate 160 and the load screw 170. Further, an insulator 194 is provided between the stiffener 192 and the PCB 190, wherein a bottom surface of the insulator 194 contacts a top surface of the stiffener 192, and wherein a top surface of the insulator 194 contacts a bottom surface of the PCB 190.

Figure 2:
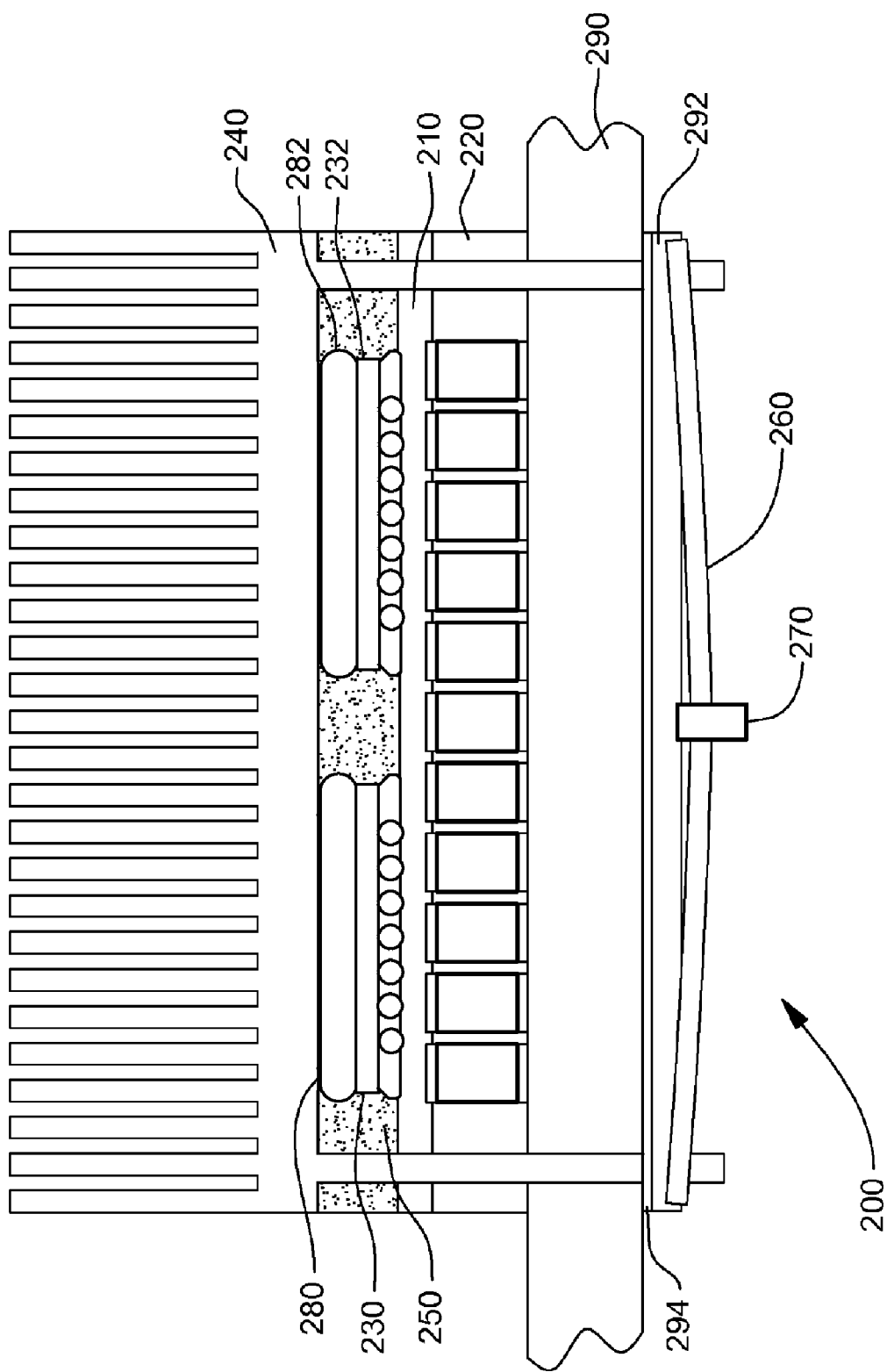
FIG. 2 is a diagram illustrating a sandwiched organic LGA structure including two chips.

Referring to FIG. 2, a multi-chip structure 200 is shown including two or more chips (chips 230 and 232), and an elastomer 250 cut out to be around the sides of each of the chips 230 and 232. Spheres (not shown) are embedded in the elastomer 250 between an organic substrate 210 and the heatsink 240; and, thermal conductors 280 and 282 are between a heat sink 240 and the chips 230 and 232, respectively. Similarly to structure 100, the structure 200 also includes the interposer 220, the load spring plate 260, the load screw 270, the PCB 290, the stiffener 292, and the insulator 294.

Figure 3:
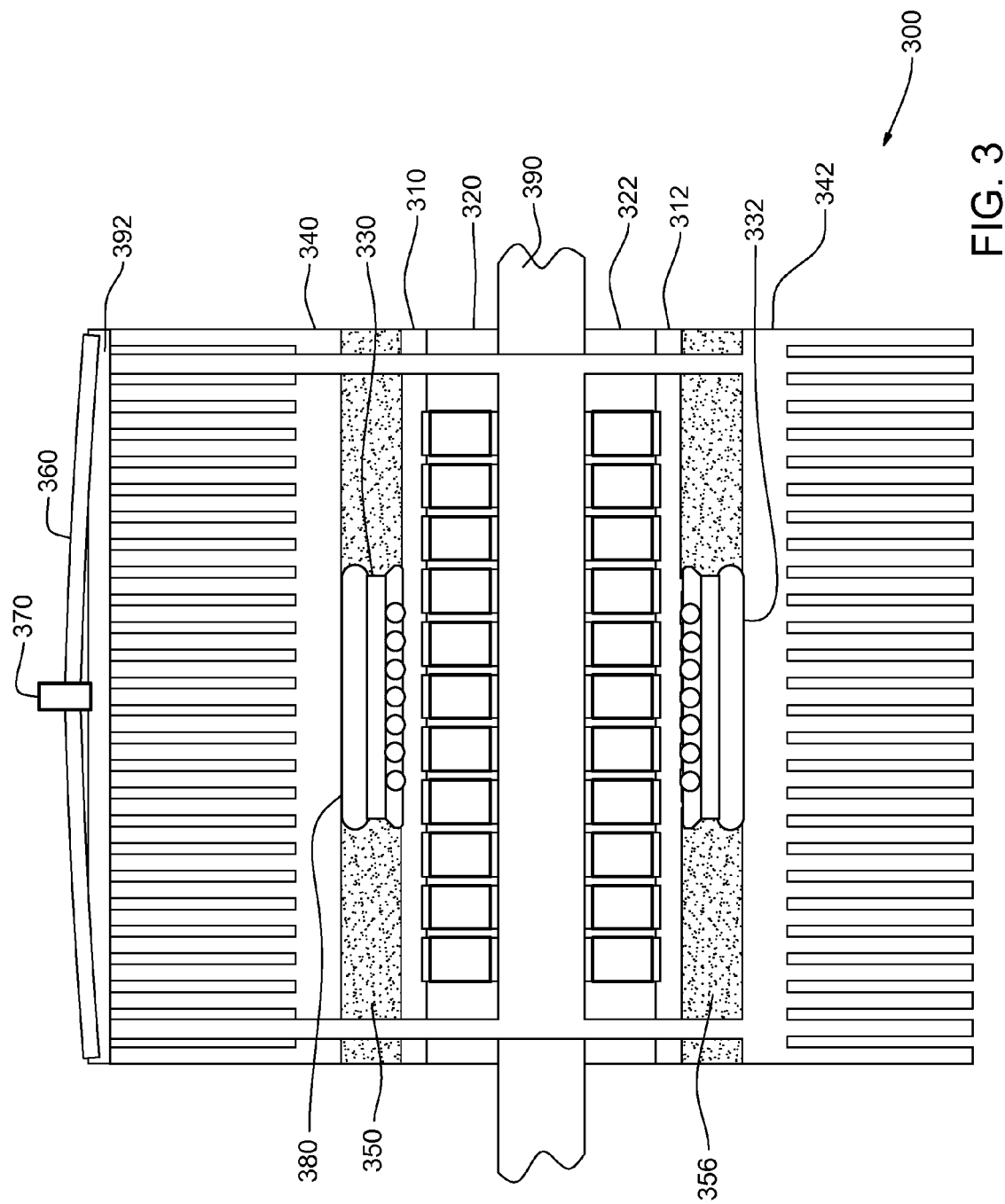
FIG. 3 is a diagram illustrating a sandwiched organic LGA structure including two substrates.

Referring now to FIG. 3, a two-sided structure 300 is shown where dual heat sinks 340 and 342 are on either side of a PCB 390. Additionally, retention hardware and screws could be on one or both sides of the structure 300 dependent on needs.

More specifically, a bottom of an LGA "like" interposer 320 contacts a top of the PCB 390; and, a bottom of an organic substrate 310 contacts a top of the LGA Interposer 320. Bottoms of spheres (not shown), which are embedded in the elastomer, contact a top of the organic substrate 310, a bottom of a heatsink 340 contacts tops of the spheres, and a bottom of a thermal conductor 380 contacts a top of the chip 330, wherein a top of the thermal conductor 380 contacts a bottom of the heat sink 340. An elastomer 350 is between the organic substrate 310 and the heat sink 340, wherein a bottom of the elastomer 350 contacts the top of the organic substrate 310 and a top of the elastomer 350 contacts the bottom of the heat sink 340. A bottom of a stiffener 392 contacts a top of the heat sink 340, and a bottom of a spring plate 360 contacts a top portion of the stiffener 392, wherein a load screw 370 is in a middle portion of the spring plate 360.

Moreover, a top of an LGA "like" interposer 322 contacts a bottom of the PCB 390, and a top of an organic substrate 312 contacts a bottom of the LGA Interposer 322. Tops of spheres (not shown), which are embedded in the elastomer, contact a bottom of the organic substrate 312, a top of a heatsink 342 contacts bottoms of the spheres, and a top of a thermal conductor 382 contacts a bottom of the chip 332, wherein a bottom of the thermal conductor 382 contacts a top of the heat sink 342. An elastomer 356 is between the organic substrate 312 and the heat sink 342, wherein a top of the elastomer 356 contacts the bottom of the organic substrate 312 and a bottom of the elastomer 356 contacts the top of the heat sink 342.

Furthermore, the embodiments of the invention present a method of 3-D packing of electronic assemblies and/or sub-assemblies using LGA contacts. Rework is now available/possible, since there is no soldered connection. The retention hardware can be unassembled and the faulty layer can be replaced.

Layers do not need to be all the same size or shape; they can be optimized to allow for optimized signal/power distribution to upper layers. Standard subassemblies can be developed which are used in multiple configurations based in system requirements. These subassemblies can be tailored based on applications; i.e. memory, communications (i.e. wire or optic), power (including voltage regulation), etc.

Figure 4:
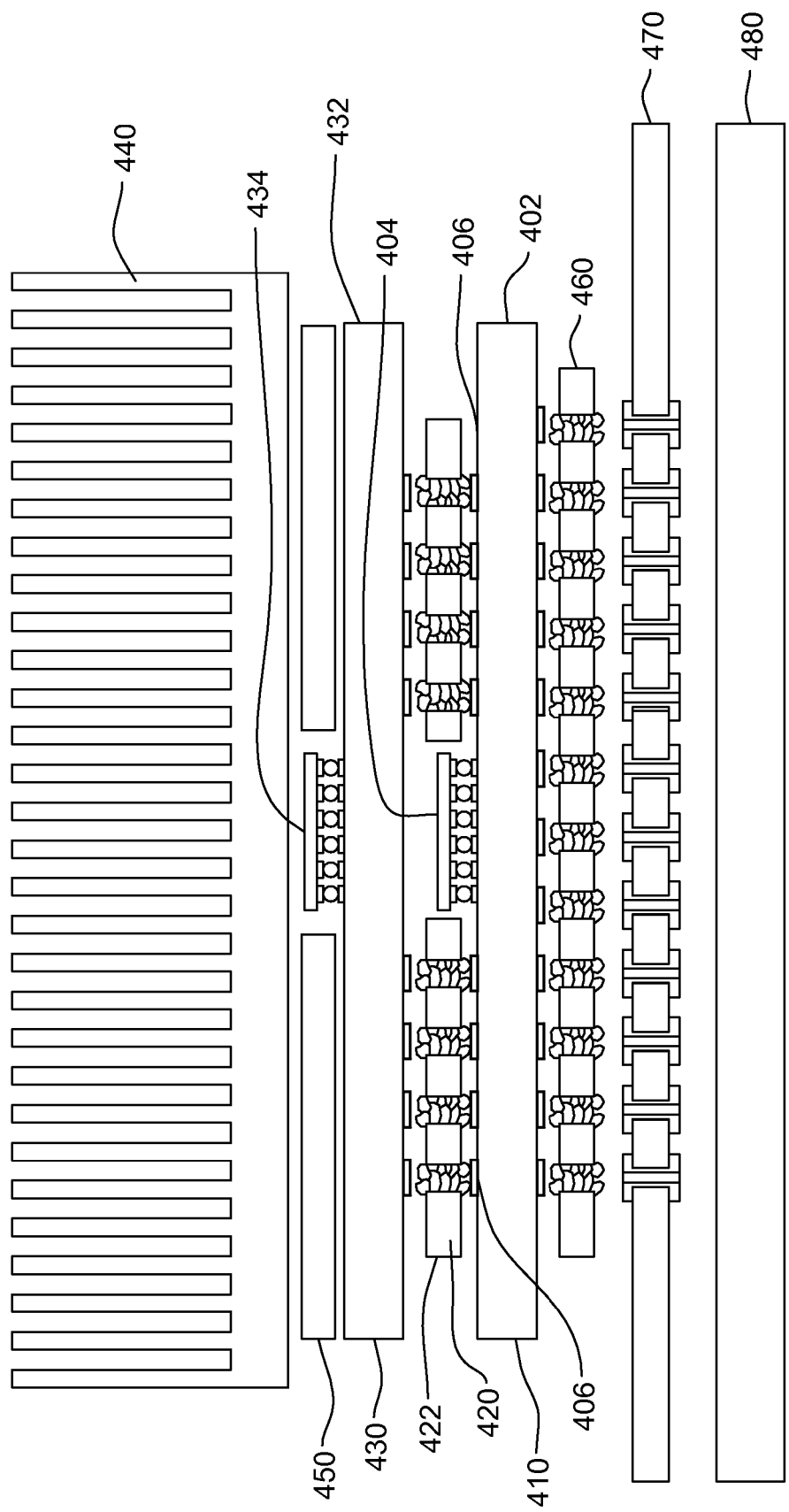
FIG. 4 is a diagram illustrating a sandwiched organic LGA structure including multiple LGA interposers.

Die do not need be all centered, they can be staggered to allow for optimized power/signal wiring. Contacts can be center region and/or perimeter configuration. This is compatible with organic and ceramic substrates. FIG. 4 illustrates a structure 400, which is assembled in the following way: Die 404 is joined to organic substrate 402 forming layer 410. Organic substrate 402 topside has pads 406 to allow attachment of another organic substrate 430.

LGA interposer 422 is placed onto layer 410, not covering the die 404 on layer 410 but connecting to contact pads 406 on topside forming module layer 420. A second LGA or organic substrate 432 with die 434 joined is then placed onto LGA interposer 422, forming a second functional layer, module layer 430. This layer is in a format that can be pre-tested, since it is an uncapped module. This may be repeated for as many layers as needed. Each layer does not need to have a die on it; it can have other devices, such as, for example, capacitors, voltage regulators, pull up/pull-down or impedance resistors, fuses, etc.

The structure 400 also includes a heatsink 440 above the module layer 430, wherein a filler 450 is between the heatsink 440 and the module layer 430. It is recognize that the heatsink 440 could include or be replaced by a mechanical load apparatus. A second LGA interposer 460 is below the bottom surface of the organic substrate 402, wherein a printed wiring board 470 is below the bottom surface of the second LGA interposer 460. Further, a stiffener 480 is below the bottom surface of the printed wiring board 470.

The structure 400 is then held together by joining the heatsink 440 to the printed wiring board 470 using industry standard LGA techniques. Thus, the structure 400 allows 3-D stacking (a reworkable 3-D chip/module stack).

Accordingly, the embodiments of the invention provide a structure, method, etc. for a sandwiched organic LGA structure having at least one semiconductor device over a substrate and a mechanical load apparatus over the semiconductor device. As discussed above, FIG. 1 illustrates a chip 130 attached to an organic substrate 110 and a heat sink 140 over the chip 130.

The structure further includes a load-distributing material between the mechanical load apparatus and the semiconductor device and/or the substrate. The load-distributing material can comprise a compressible filler. Specifically, the load-distributing material is proximate a first side of the semiconductor device and proximate a second side of the semiconductor device opposite the first side of the semiconductor device. The load-distributing material completely surrounds the semiconductor device and contacts the mechanical load apparatus, the substrate, and the semiconductor device. Furthermore, the load-distributing material can be thermally conductive and comprises an elastomer and/or a liquid. As discussed above, the load-distributing material will directly and equally couple the stresses induced by retention hardware through the complete module. The equal dispersion will prevent warping, localized/focused stresses.

The load-distributing material comprises a LGA interposer adapted to connect the substrate to a printed circuit board (PCB) below the substrate and/or a second substrate. As discussed above, rework is now available/possible, since there is no soldered connection. The retention hardware can be unassembled and the faulty layer can be replaced. Moreover, the load-distributing material comprises compressible material layers and rigid material layers. The load-distributing material comprises a rigid material incased in a compressible material. As discussed above, using a tolerance analysis, rigid layer thickness is designed to match the minimum spacing and the compressible material is designed to accommodates the tolerance range. The structure also includes a non-load bearing thermally conductive material between the semiconductor device and the mechanical load apparatus. As discussed above, the rigid material (spheres) imbedded in the elastomer could act as height control that prevents the heatsink from coming too close to the chip and pushing all of a thermal conductor out.

Additionally, the structure includes the PCB below the substrate, a lower substrate below the PCB, and at least one lower semiconductor device below the lower substrate. A lower mechanical load apparatus is below the lower semiconductor device and a lower load-distributing material is between the lower mechanical load apparatus and the lower semiconductor device and/or the lower substrate. Moreover, the lower load-distributing material is proximate a first side of the lower semiconductor device and proximate a second side of the lower semiconductor device opposite the first side of the lower semiconductor device. As discussed above, FIG. 3 illustrates a two-sided structure where the components hold and dual heat sinks are on either side of the PCB. Additionally, retention hardware and screws could be on one or both sides of the structure dependent on needs.

A method of forming a LGA structure is also provided, including forming at least one semiconductor device over a substrate. As discussed above, FIG. 1 illustrates a chip 130 attached to an organic substrate 110 and a heat sink 140 over the chip 130. Next, the method forms a load-distributing material above the semiconductor device and/or the substrate such that the load-distributing material is proximate a first side of the semiconductor device and proximate a second side of the semiconductor device opposite the first side of the semiconductor device. As discussed above, the load-distributing material can also aid in improving the thermal properties of the module. The load-distributing material can comprise a compressible filler.

Specifically, the load-distributing material is formed such that the load-distributing material completely surrounds the semiconductor device and contacts the mechanical load apparatus, the substrate, and the semiconductor device. The load-distributing material is also formed such that the load-distributing material can be thermally conductive, and such that the load-distributing material comprises an elastomer and/or a liquid. As discussed above, this filler will directly and equally couple the stresses induced by retention hardware through the complete module. The equal dispersion will prevent warping, localized/focused stresses. Moreover, the load-distributing material is formed such that it comprises a LGA interposer adapted to connect the substrate to a PCB below the substrate and/or a second substrate. As discussed above, rework is now available/possible, since there is no soldered connection. The retention hardware can be unassembled and the faulty layer can be replaced.

The method further includes, prior to forming a mechanical load apparatus, forming a non-load bearing thermally conductive material between the semiconductor device and the mechanical load apparatus. As discussed above, the rigid material (spheres) imbedded in the elastomer could act as height control that prevents the heatsink from coming too close to the chip and pushing all of a thermal conductor out. Subsequently, the mechanical load apparatus is formed over the load-distributing material.

Figure 5:
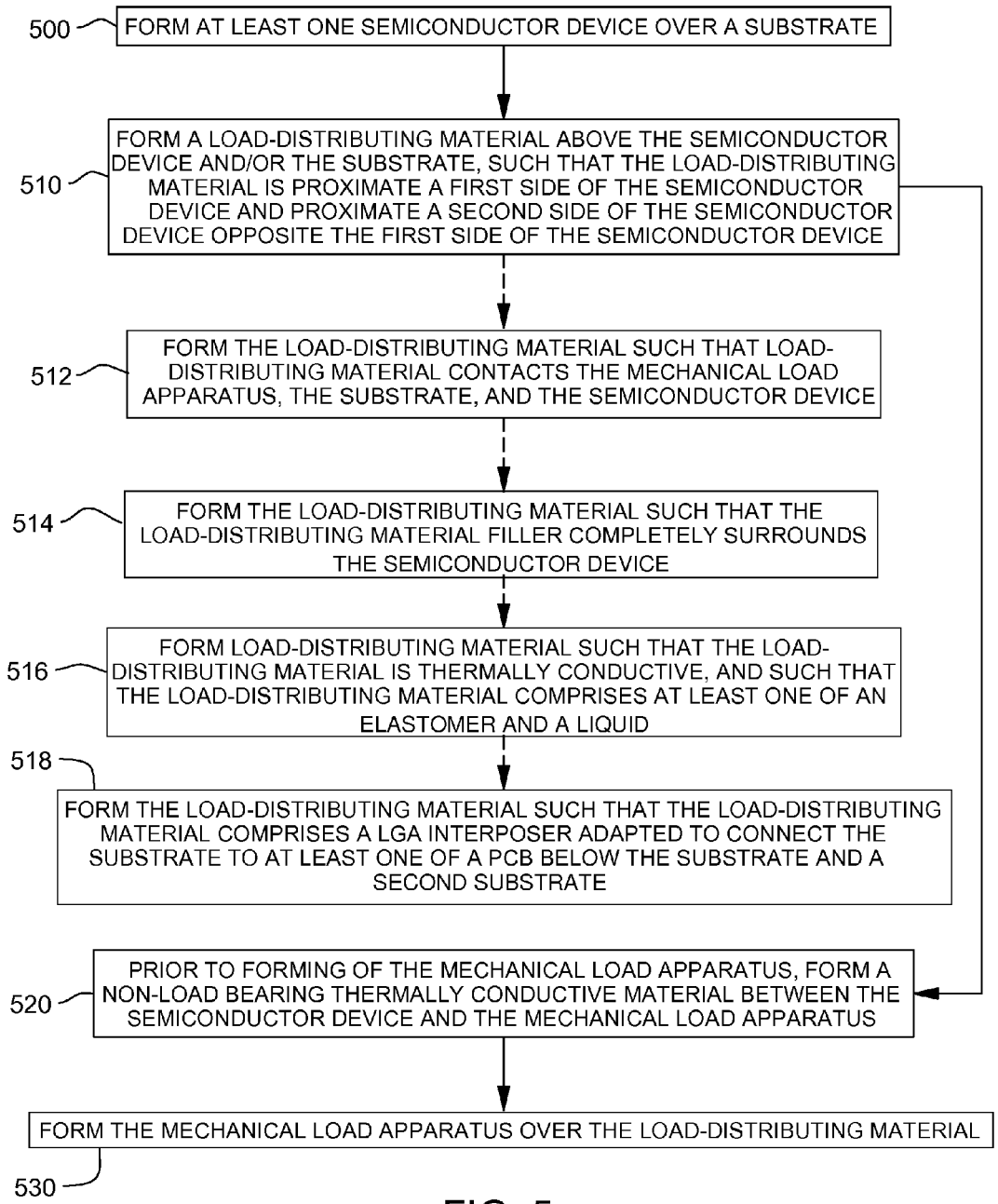
FIG. 5 is a flow diagram illustrating a method of forming a sandwiched organic LGA structure.

FIG. 5 is a flow diagram illustrating a method of forming a sandwiched organic LGA structure. The method begins in item 500 by forming (attaching) at least one semiconductor device over a substrate. As discussed above, FIG. 1 illustrates a chip 130 attached to an organic substrate 110 and a heat sink 140 over the chip 130. Next, in item 510, a load-distributing material is formed (e.g., deposited, applied, etc.) above the semiconductor device and/or the substrate, such that the load-distributing material is proximate a first side of the semiconductor device and proximate a second side of the semiconductor device opposite the first side of the semiconductor device. As discussed above, the load-distributing material can also aid in improving the thermal properties of the module. The load-distributing material can comprise a compressible filler.

This includes, in item 512, forming the load-distributing material such that load-distributing material contacts the mechanical load apparatus, the substrate, and the semiconductor device. In item 514, the load-distributing material is formed such that the load-distributing material completely surrounds the semiconductor device. As discussed above, the load-distributing material can be placed in the chip cavity by filling through a hole in the lid which is eventually sealed, as is commonly known within the art, or by filling the lid (upside down) and assembling upside down. Alternatively, the load-distributing material can be formed separately and fitted on, attached to, etc. the substrate.

Moreover, in item 516, the load-distributing material is formed such that the load-distributing material can be thermally conductive, and such that the load-distributing material comprises an elastomer and/or a liquid. As discussed above, the load-distributing material will directly and equally couple the stresses induced by retention hardware through the complete module. The equal dispersion will prevent warping, localized/focused stresses. The method also includes, in item 518, forming the load-distributing material such that the load-distributing material comprises a LGA interposer adapted to connect the substrate to at least one of a PCB below the substrate and a second substrate. As discussed above, rework is now available/possible, since there is no soldered connection. The retention hardware can be unassembled and the faulty layer can be replaced.

Following this, in item 520, prior to the forming of the mechanical load apparatus, the method forms a non-load bearing thermally conductive material between the semiconductor device and the mechanical load apparatus. As discussed above, the rigid material (spheres) imbedded in the elastomer could act as height control that prevents the heatsink from coming too close to the chip and pushing all of a thermal conductor out. Subsequently, in item 530, the mechanical load apparatus is formed over the load-distributing material.

Accordingly, the embodiments of the invention provide a method and structure for distributing the physical/mechanical forces placed upon an organic substrate as a result of lid, heatsink and retention hardware to prevent stresses which result in reliability concerns.

Furthermore, the embodiments herein allow for 3-D chip/module stacking, however uses an LGA-like approach which involves the use of interposers to which the die/modules are held against, completing the circuit. The absence of a solder requirement eliminates the concerns listed above and also aids in improving reliability. The interposer can allow for expansion, thus reducing TCE mismatch issues.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A land grid array structure, comprising:
   at least one semiconductor device over a substrate;
   a mechanical load apparatus over said semiconductor device; and
   a load-distributing material between said mechanical load apparatus and said substrate, wherein said load-distributing material is proximate a first side of said semiconductor device, and wherein said load-distributing material is proximate a second side of said semiconductor device opposite said first side of said semiconductor device,
   wherein said load-distributing material contacts said mechanical load apparatus, said substrate, and said semiconductor device.

2. The structure according to claim 1, wherein said load-distributing material completely surrounds said semiconductor device.

3. The structure according to claim 1, wherein said load-distributing material is thermally conductive and comprises at least one of an elastomer and a liquid.

4. The structure according to claim 1, further comprising a non-load bearing thermally conductive material between said semiconductor device and said mechanical load apparatus.

5. The structure according to claim 1, further comprising: a land grid array interposer adapted to connect said substrate to at least one of a printed circuit board and a second substrate.

6. The structure according to claim 1, wherein said load-distributing material comprises compressible material layers and rigid material layers.

7. The structure according to claim 1, wherein said load-distributing material comprises a rigid material incased in a compressible material.

8. The structure according to claim 1, further comprising:
a printed circuit board below said substrate;
a lower substrate below said printed circuit board;
at least one lower semiconductor device below said lower substrate;
a lower mechanical load apparatus below said lower semiconductor device; and
a lower load-distributing material between said lower mechanical load apparatus and said lower substrate, wherein said lower load-distributing material is proximate a first side of said lower semiconductor device, and wherein said lower load-distributing material is proximate a second side of said lower semiconductor device opposite said first side of said lower semiconductor device.

9. A land grid array structure, comprising:
at least one semiconductor device over a substrate;
a mechanical load apparatus over said semiconductor device;
a load-distributing material between said mechanical load apparatus and said substrate, wherein said load-distributing material is proximate a first side of said semiconductor device, wherein said load-distributing material is proximate a second side of said semiconductor device opposite said first side of said semiconductor device; and
a land grid array interposer adapted to connect said substrate to at least one of a printed circuit board and a second substrate,
wherein said load-distributing material contacts said mechanical load apparatus, said substrate, and said semiconductor device.

10. The structure according to claim 9, further comprising a non-load bearing thermally conductive material between said semiconductor device and said mechanical load apparatus.

11. A land grid array structure, comprising:
at least one semiconductor device over a substrate;
a mechanical load apparatus over said semiconductor device;
a load-distributing material between said mechanical load apparatus and said substrate, wherein said load-distributing material is proximate a first side of said semiconductor device, wherein said load-distributing material is proximate a second side of said semiconductor device opposite said first side of said semiconductor device; and
a land grid array interposer adapted to connect said substrate to at least one of a printed circuit board and a second substrate,
wherein said load-distributing material completely surrounds said semiconductor device.

12. A land grid array structure, comprising:
at least one semiconductor device over a substrate;
a mechanical load apparatus over said semiconductor device;
a load-distributing material between said mechanical load apparatus and said substrate, wherein said load-distributing material is proximate a first side of said semiconductor device, wherein said load-distributing material is proximate a second side of said semiconductor device opposite said first side of said semiconductor device; and
a land grid array interposer adapted to connect said substrate to at least one of a printed circuit board and a second substrate,
wherein said load-distributing material is thermally conductive and comprises at least one of an elastomer and a liquid.

* * * * *